US012616028B2

(12) United States Patent
Li et al.

(10) Patent No.: US 12,616,028 B2
(45) Date of Patent: Apr. 28, 2026

(54) SEAL RING STRUCTURE IN A SEMICONDUCTOR DEVICE AND METHODS FOR FORMING THE SAME

(71) Applicant: YANGTZE MEMORY TECHNOLOGIES CO., LTD., Wuhan (CN)

(72) Inventors: Qian Li, Wuhan (CN); Shu Wu, Wuhan (CN); Liang Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 769 days.

(21) Appl. No.: 17/689,735

(22) Filed: Mar. 8, 2022

(65) Prior Publication Data

US 2023/0096141 A1 Mar. 30, 2023

(30) Foreign Application Priority Data

Sep. 28, 2021 (WO) ................ PCT/CN2021/121492

(51) Int. Cl.
| | |
|---|---|
| *H01L 23/58* | (2006.01) |
| *H01L 21/768* | (2006.01) |
| *H01L 23/48* | (2006.01) |
| *H01L 21/50* | (2006.01) |
| *H01L 25/00* | (2006.01) |

(52) U.S. Cl.
CPC ...... *H01L 23/585* (2013.01); *H01L 21/76898* (2013.01); *H01L 23/481* (2013.01); *H01L 21/50* (2013.01); *H01L 25/50* (2013.01)

(58) Field of Classification Search
CPC ..... H01L 23/12–15; H01L 23/28–3192; H01L 23/16–26; H01L 23/42–4338; H01L 23/3142; H01L 23/02–10; H05B 33/04; H10K 50/841–8428; B81C 1/00269; B81C 2203/0109–019; B81B 7/0032–0077; B81B 2207/091
See application file for complete search history.

(56) References Cited

U.S. PATENT DOCUMENTS

| | | | | |
|---|---|---|---|---|
| 2002/0179921 A1* | 12/2002 | Cohn | ...................... | H01L 23/10 |
| | | | | 257/E33.056 |
| 2014/0217557 A1* | 8/2014 | Chen | ................... | B81C 1/00825 |
| | | | | 257/620 |
| 2016/0020181 A1* | 1/2016 | Yu | ....................... | H01L 23/3171 |
| | | | | 257/737 |
| 2017/0141052 A1* | 5/2017 | Pan | ........................ | H01L 23/564 |
| 2018/0269161 A1* | 9/2018 | Wu | ....................... | H01L 23/564 |
| 2019/0348336 A1* | 11/2019 | Katkar | .................... | H01L 24/80 |
| 2021/0111093 A1* | 4/2021 | Sinha | ...................... | H01L 23/10 |
| 2021/0280481 A1* | 9/2021 | He | ........................ | H01L 23/564 |

(Continued)

*Primary Examiner* — Jeff W Natalini
*Assistant Examiner* — Andrew John Zabel
(74) *Attorney, Agent, or Firm* — BAYES PLLC

(57) ABSTRACT

In certain aspects, a semiconductor device includes a first semiconductor layer, a first semiconductor structure formed on the first semiconductor layer including a main chip region, and seal ring discontinuous contact structures formed in a seal ring region enclosing the main chip region. Each seal ring discontinuous contact structure includes a seal ring body portion and a through silicon contact (TSC) portion penetrating through the first semiconductor layer and coupled to the seal ring body portion.

19 Claims, 13 Drawing Sheets

(56) References Cited

U.S. PATENT DOCUMENTS

2021/0313240  A1*  10/2021  Tanamachi ........ H01L 23/53295
2021/0407904  A1*  12/2021  Liang ................ H01L 21/76805
2022/0310464  A1*   9/2022  Huang .................. H01L 23/585
2022/0384369  A1*  12/2022  Tang ..................... H01L 23/564

* cited by examiner

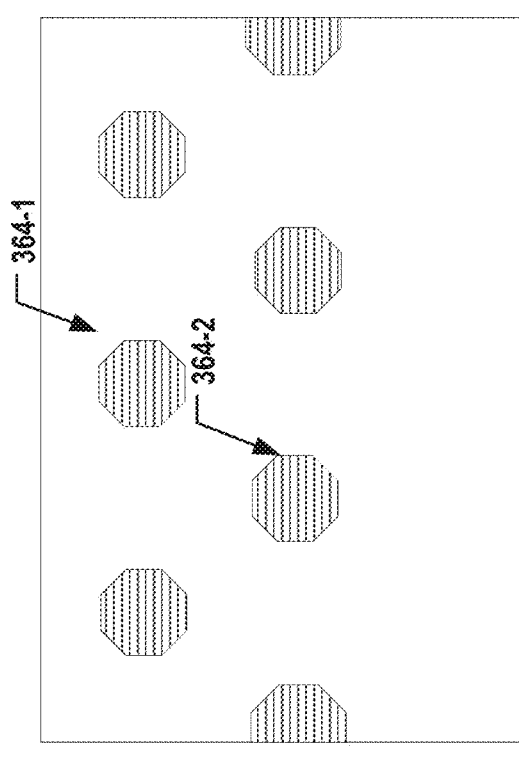
FIG. 3D
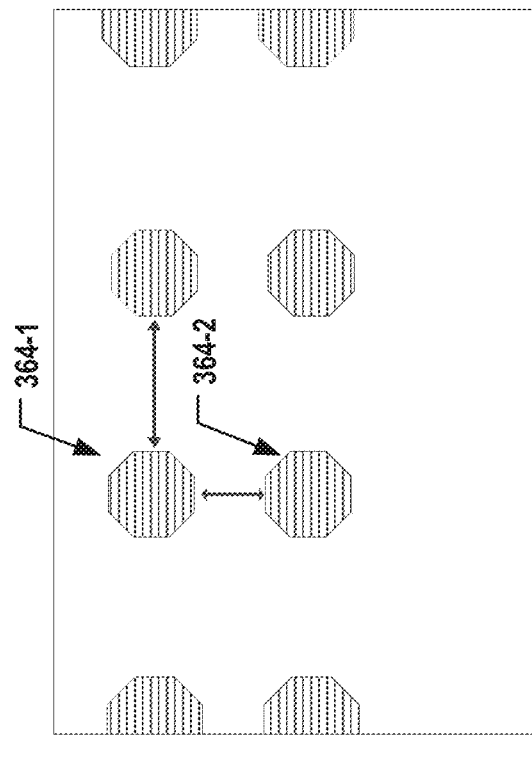
FIG. 3C
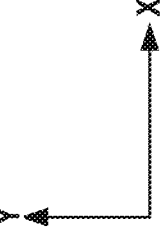

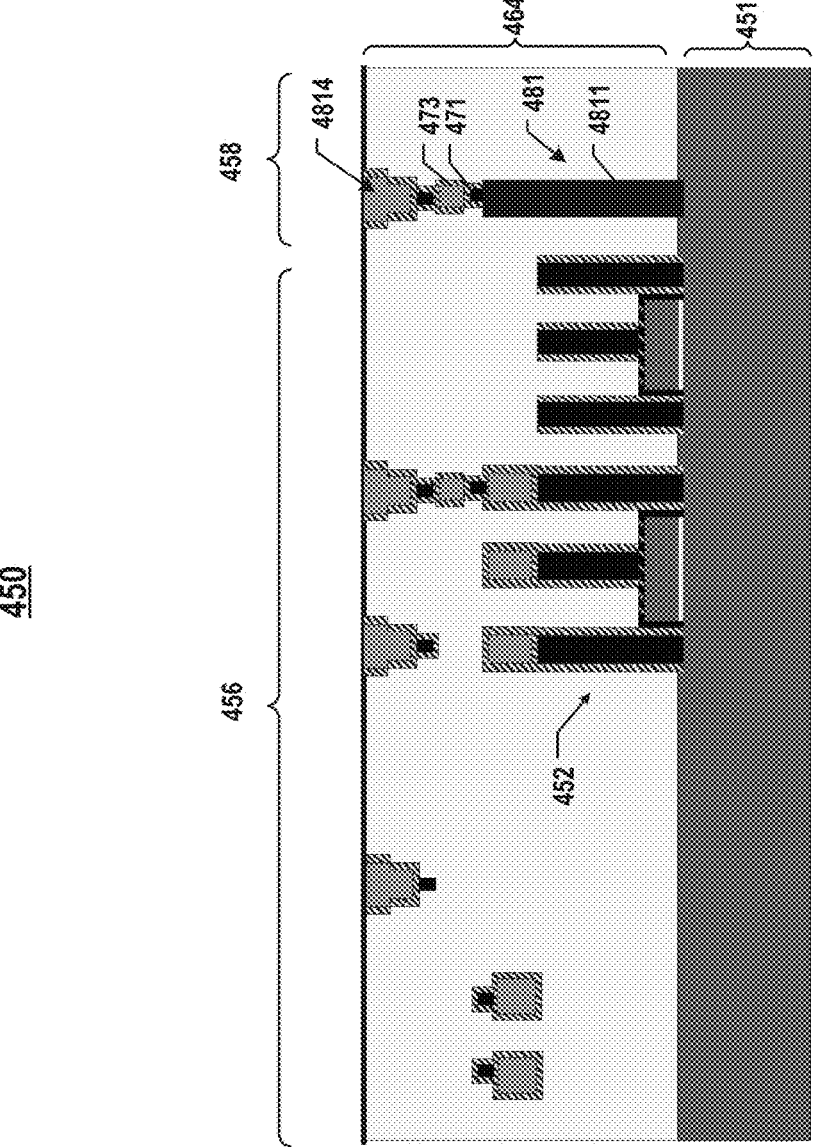
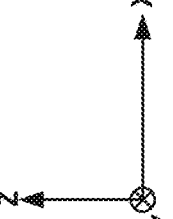
FIG. 4B

500

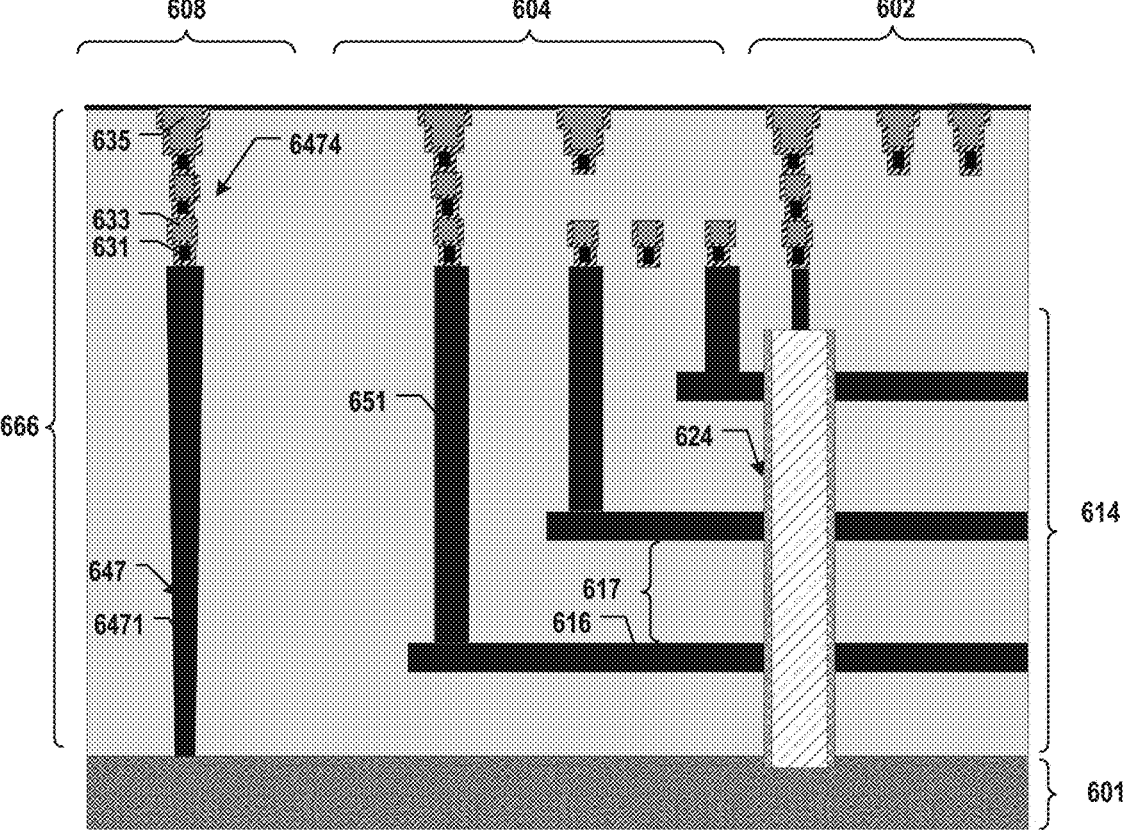
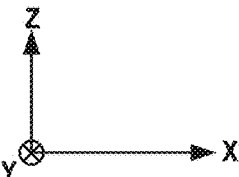
FIG. 6A

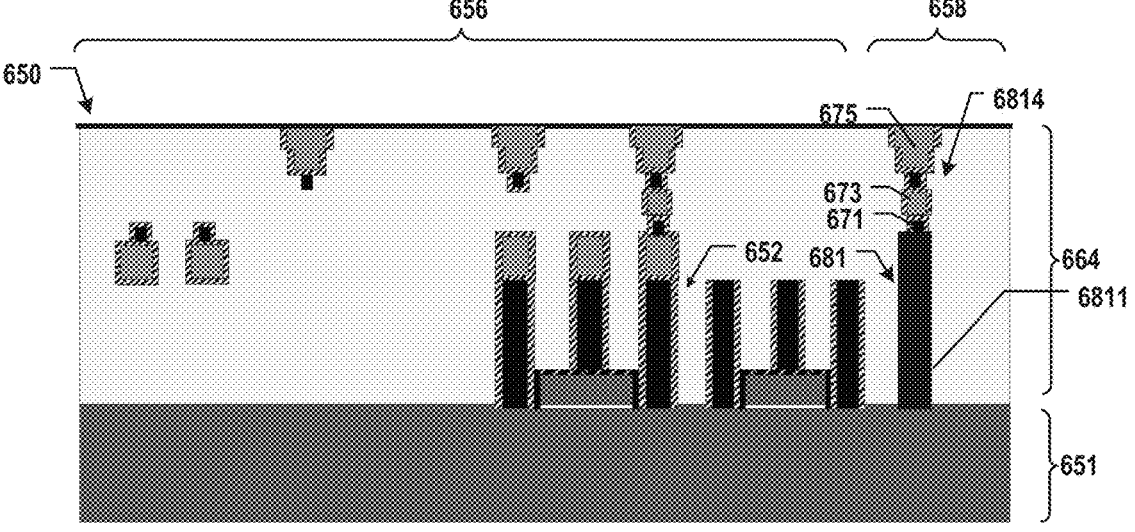
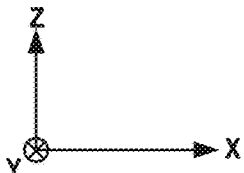
FIG. 6B

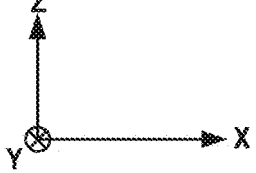
650
651
681
6811
664
671
673
675
652
6814
635
6474
633
631
654
644
666
641
624
614
647
6471
617
616
601
6281
6477
FIG. 6C

700

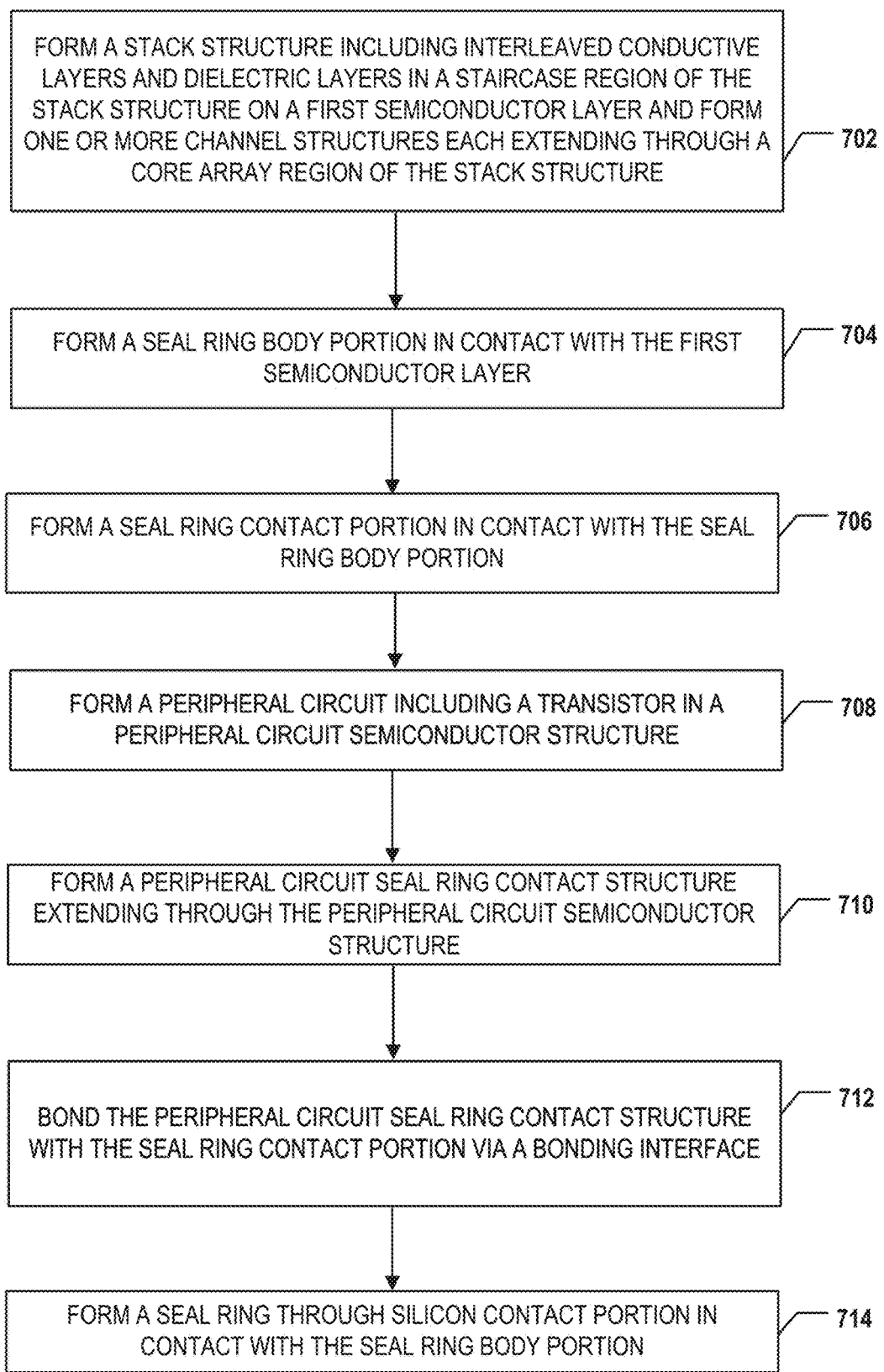

FORM A STACK STRUCTURE INCLUDING INTERLEAVED CONDUCTIVE LAYERS AND DIELECTRIC LAYERS IN A STAIRCASE REGION OF THE STACK STRUCTURE ON A FIRST SEMICONDUCTOR LAYER AND FORM ONE OR MORE CHANNEL STRUCTURES EACH EXTENDING THROUGH A CORE ARRAY REGION OF THE STACK STRUCTURE — 702

FORM A SEAL RING BODY PORTION IN CONTACT WITH THE FIRST SEMICONDUCTOR LAYER — 704

FORM A SEAL RING CONTACT PORTION IN CONTACT WITH THE SEAL RING BODY PORTION — 706

FORM A PERIPHERAL CIRCUIT INCLUDING A TRANSISTOR IN A PERIPHERAL CIRCUIT SEMICONDUCTOR STRUCTURE — 708

FORM A PERIPHERAL CIRCUIT SEAL RING CONTACT STRUCTURE EXTENDING THROUGH THE PERIPHERAL CIRCUIT SEMICONDUCTOR STRUCTURE — 710

BOND THE PERIPHERAL CIRCUIT SEAL RING CONTACT STRUCTURE WITH THE SEAL RING CONTACT PORTION VIA A BONDING INTERFACE — 712

FORM A SEAL RING THROUGH SILICON CONTACT PORTION IN CONTACT WITH THE SEAL RING BODY PORTION — 714

SEAL RING STRUCTURE IN A SEMICONDUCTOR DEVICE AND METHODS FOR FORMING THE SAME

CROSS-REFERENCES TO RELATED APPLICATIONS

This application claims the benefit of priority to International Application No. PCT/CN2021/121492, filed on Sep. 28, 2021, entitled "SEAL RING STRUCTURE IN A SEMI-CONDUCTOR DEVICE AND METHODS FOR FORM-ING THE SAME," which is incorporated herein by reference in its entirety.

BACKGROUND

The present disclosure relates to seal ring structure in a semiconductor device, and fabrication methods thereof.

Planar memory cells are scaled to smaller sized by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation of planar memory cells. The 3D memory architecture includes a memory array and peripheral circuits for facilitating operations of the memory array.

Seal ring is a protection structure that at least partially surrounds the main chip region of the 3D memory devices or the peripheral circuits and provides protection against various types of damages, moistures, or containments.

SUMMARY

In one aspect, a semiconductor device includes a first semiconductor layer, a first semiconductor structure on the first semiconductor layer including a main chip region, and seal ring discontinuous contact structures formed in a seal ring region, and the seal ring region encloses the main chip region. Each seal ring discontinuous contact structure includes a seal ring body portion.

In some implementations, a length of the seal ring body portion is between 10 μm and 50 μm.

In some implementations, the seal ring discontinuous contact structures form a rectangle shape and have four sides in the plan view.

In some implementations, the seal ring discontinuous contact structures form a hexagon shape with six sides in the plan view.

In some implementations, each seal ring discontinuous contact structure includes circular shape, oval shape, rectangle shape, elongated circular, oval, or rectangle shape, in the plan view.

In some implementations, the seal ring discontinuous contact structures includes inner seal ring discontinuous contact structures and outer seal ring discontinuous contact structures at least partially surrounding the inner seal ring discontinuous contact structures.

In some implementations, each two of the adjacent outer seal ring discontinuous contact structures and inner seal ring discontinuous contact structures are staggered arranged in the plan view.

In some implementations, each two of the adjacent outer seal ring discontinuous contact structures and inner seal ring discontinuous contact structures are arranged in aligned with each other in the plan view.

In some implementations, each two of the adjacent inner seal ring discontinuous contact structures have a minimum distance between 1000 nm and 2000 nm.

In some implementations, each two of the adjacent outer seal ring discontinuous contact structures and inner seal ring discontinuous contact structures have a minimum distance between 200 nm and 800 nm.

In some implementations, the first semiconductor structure includes a first stack structure having interleaved conductive layers and dielectric layers, and the first stack structure includes a core array region and a staircase region in a plan view. The main chip region includes the core array region and the staircase region, and the semiconductor device includes one or more channel structures each extending through the core array region of the first stack structure.

In some implementations, the semiconductor device further includes a through silicon contact (TSC) portion penetrating through the first semiconductor layer and coupled to the seal ring body portion.

In some implementations, the semiconductor device further includes a transistor in a peripheral circuit main chip region, and a peripheral circuit seal ring contact structure in a peripheral circuit seal ring region which encloses the peripheral circuit main chip region laterally. And the peripheral circuit seal ring contact structure is coupled to the seal ring discontinuous contact structures.

In some implementations, the semiconductor device further includes a transistor contact structure in the peripheral circuit main chip region connected between the transistor and the first semiconductor structure.

In some implementations, the semiconductor device further includes a transistor in the main chip region of the first semiconductor structure.

In another aspect, a method for forming a semiconductor device includes forming a first semiconductor structure having a main chip region on a first semiconductor layer; forming one or more seal ring body portions each extending through a seal ring region which encloses the main chip region and each in contact with the first semiconductor layer; and forming one or more seal ring contact portions each in contact with the respective seal ring body portion. And the one or more seal ring body portions and the one or more seal ring contact portions form one or more seal ring discontinuous contact structures.

In some implementations, the method further includes forming one or more seal ring through silicon contact (TSC) portions each extending through the first semiconductor layer and in contact with the respective seal ring body portion.

In some implementations, the method further includes etching the first semiconductor layer to form one or more seal ring TSC recesses, and forming the seal ring TSC portions in the respective seal ring TSC recesses.

In some implementations, the one or more seal ring contact portions, the one or more seal ring body portions, and the one or more seal ring TSC portions form one or more seal ring discontinuous contact structures.

In some implementations, the first semiconductor structure includes interleaved conductive layers and dielectric layers in a staircase region of the first semiconductor structure, and the method further includes forming one or more channel structures each extending through a core array region of the first semiconductor structure. The staircase region and the core array region are in the main chip region.

In some implementations, the first semiconductor structure includes a transistor in the main chip region.

In still another aspect, a method for forming a semiconductor device includes forming a first stack structure comprising interleaved conductive layers and dielectric layers in a staircase region of the first stack structure on a first semiconductor layer, forming one or more channel structures each extending through a core array region of the first stack structure, forming one or more seal ring body portions each extending through a seal ring region which encloses the staircase region and the core array region and each in contact with the first semiconductor layer, forming one or more seal ring contact portions in contact with the respective seal ring body portions, forming a peripheral circuit having a transistor in a peripheral circuit semiconductor structure on a second semiconductor layer, forming one or more peripheral circuit seal ring contact structures extending through the peripheral circuit semiconductor structure, bonding the one or more peripheral circuit seal ring contact structures to the respective seal ring contact portions, and forming a seal ring through silicon contact (TSC) portion in contact with the seal ring body portion.

In some implementations, the method further includes planarizing or thinning the first semiconductor layer after bonding the peripheral circuit seal ring contact structure to the seal ring contact portion. Forming the one or more seal ring TSC portions each in contact with the respective seal ring body portion includes etching the first semiconductor layer to form one or more seal ring TSC recesses, and forming the one or more seal ring TSC portions in the respective seal ring TSC recesses.

In some implementations, the one or more seal ring contact portions, the one or more seal ring body portions, and the one or more seal ring TSC portions form one or more seal ring discontinuous contact structures.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 3C and 3D illustrate plan views of a semiconductor chip having different arrangements of seal ring discontinuous contact structures, according to some aspects of the present disclosure.

FIG. 4B illustrates a side view of a cross-section of a peripheral circuit, according to some aspects of the present disclosure.

Figure 5:
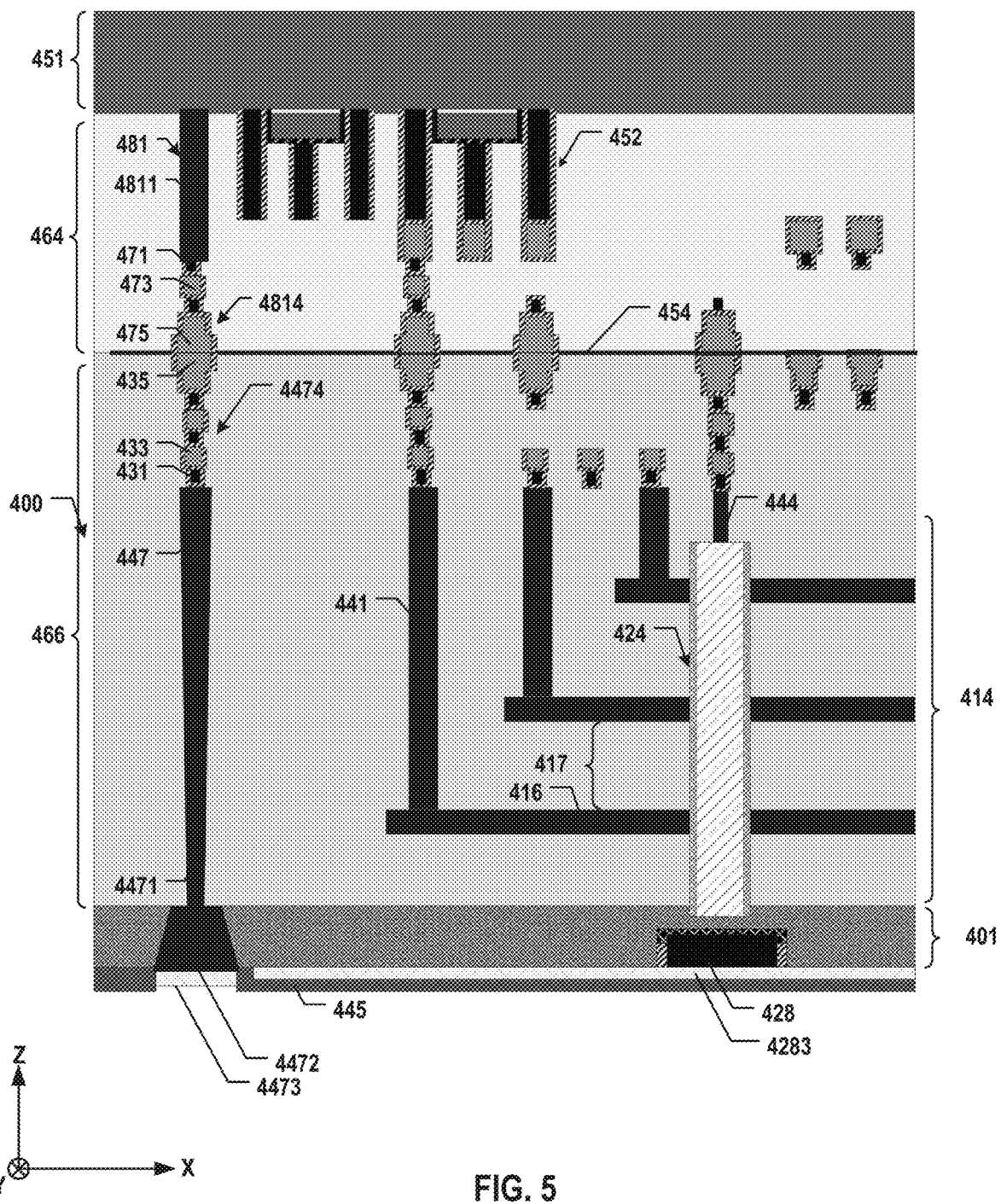

FIG. 5 illustrates a side view of a cross-section of a 3D memory device including a memory array circuit and a peripheral circuit connected to the memory array circuit, according to some aspects of the present disclosure.

FIGS. 6A-6C illustrate a fabrication process for forming a 3D memory device, according to some aspects of the present disclosure.

FIG. 7 illustrates a flowchart of a method for forming an exemplary 3D memory device, according to some aspects of the present disclosure.

Figure 8:
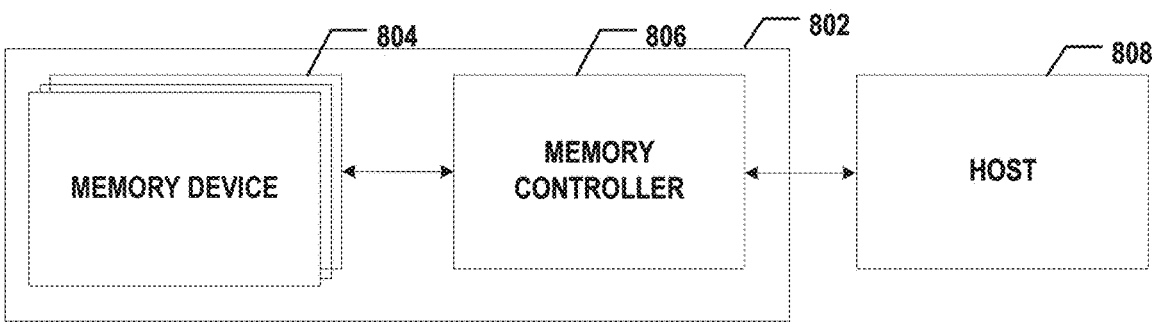

FIG. 8 illustrates a block diagram of an exemplary system having a 3D memory device, according to some aspects of the present disclosure.

Figure 9A:
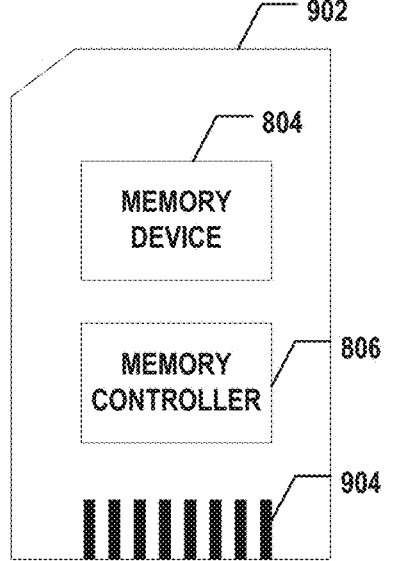

FIG. 9A illustrates a diagram of an exemplary memory card having a 3D memory device, according to some aspects of the present disclosure.

Figure 9B:
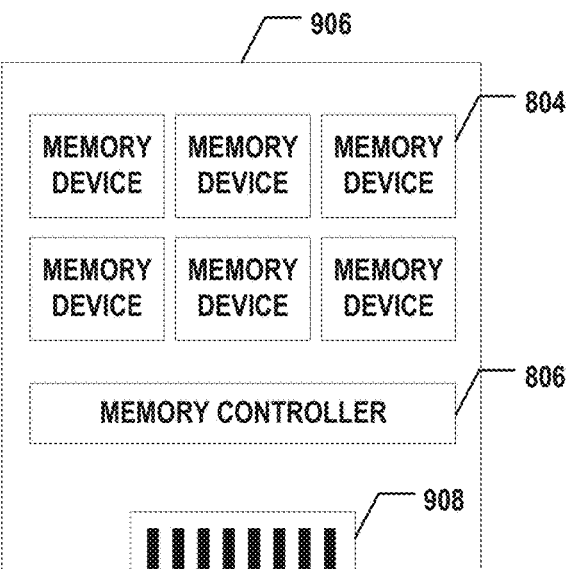

FIG. 9B illustrates a diagram of an exemplary solid-state drive (SSD) having a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow.

Seal ring is a protection structure that at least partially surrounds the main chip region of the three-dimensional (3D) memory devices, such as 3D NAND Flash memory devices, the peripheral circuits, or other types of semiconductor devices, and protect against various types of damages, such as Electrostatic Discharge (ESD), oxygen, moisture, and mechanical damages. Although the present application uses the 3D memory devices and corresponding peripheral circuits as examples of the seal ring structures formed thereon, it is noted that the other types of semiconductor devices can also have the seal ring structures as to some implementations of the present disclosure. The seal ring can be formed for each chip. Seal ring may include a relatively lengthy seal ring body portion extending through the stack structure of the 3D memory device and a seal ring through silicon contact (TSC, a.k.a. through substrate contact) portion connected to the seal ring body portion and penetrating through a substrate of the 3D memory device. In some implementations, the TSC portion is connected to the seal ring body portion and penetrates through a redeposition silicon instead of the substrate of the 3D memory device. However, the lengthy seal ring body portion may cause tilting issues and stress issues from time to time and thus reduce the yield rate of the 3D memory device. In particular, since the length of the seal ring body is relatively long, for example, between 10 μm and 50 μm, it may tilt to an angle of, for example, 5 to 10 degrees during the deposition process, thereby creating a misalignment between the seal ring body portion and the seal ring TSC portion. This is misalignment creates an open circuit failure mode for the 3D memory device and thus needs to be addressed. Furthermore, since the seal ring body portion is lengthy, the mechanical strains and stresses may be developed and accumulated during the fabrication and therefore causing failure of the chip. Furthermore, the etching of the deep trench to deposit the metal material to form the seal ring body portion may also form a dishing profile in the top portion of the trench. The dishing profile includes a tapered shape at the end of the trench. This tapered shape allows gases, such as fluorine (F), to be accumulated in the dishing profile during the filing of the conductive material to form the seal ring contact portion. The large accumulation of the gases leads to a big void and/or bubbles formed within the top of the seal ring contact portion. The big void and/or bubbles formed near the seal ring contact portion may isolate and separate the seal ring contact portion from other contact structures, such as a peripheral circuit contact structure of a peripheral circuit bonded to the seal ring contact portion, which causes an open circuit between the two circuits. This is also known as a puddle effect or bubble issue. Also, one of the bonding methods is to anneal two bonding contacts of two respective wafers and thus swell the two bonding contacts until they merged or bonded together. If the seal ring bonding contact is formed in a continuous trench, the bubbles may be generated randomly across the entire trench which lead to unwanted bubble issue. Moreover, a continuous trench generally has a large critical dimension due to the process limitations. The larger critical dimension the trench has, the more and larger bubbles are generated in the dishing profile of the trench.

To address one or more of the aforementioned issues, the present disclosure introduces a solution in which one or more seal ring discontinuous contact structures, for example, a seal ring via structure including a seal ring TSC portion, a seal ring body portion coupled to the seal ring TSC portion, and a seal ring contact portion coupled to the seal ring body portion. The one or more seal ring discontinuous contact structures are configured to reduce the tilting issue and the stress issue generated by the seal ring TSC portion and the seal ring body portion. In particular, because the seal ring discontinuous contact structure is a discrete structure, such as a seal ring pillar formed in a seal ring via, the stress is not as high as a continuous structure, such as a seal ring wall formed in a seal ring trench. Furthermore, a smaller critical dimension means a smaller tilting angle can be formed. Due to the process limitation, a via process is easier to form a smaller critical dimension than a trench process. Therefore, by using a discontinuous via instead of a continuous trench to deposit the metal of the seal ring, the tilting angle can be minimized, and the misalignment issue between the seal ring TSC portion and the seal ring body portion can be solved. Finally, by using the discontinuous via instead of the continuous trench to deposit seal ring contact portion, during the annealing of the bonding process, two bonding contacts of two respective wafers may swell in their respective vias rather than the entire trench, which reduces the randomly distributed bubbles formed therein. The unwanted bubble issue can thus be minimized. Also, discontinuous via process generally has a smaller critical dimension than continuous trench process. Therefore, by using the discontinuous via instead of the continuous trench, the critical dimension shrinks, and the bubbles are reduced in both size and number.

Figure 1:
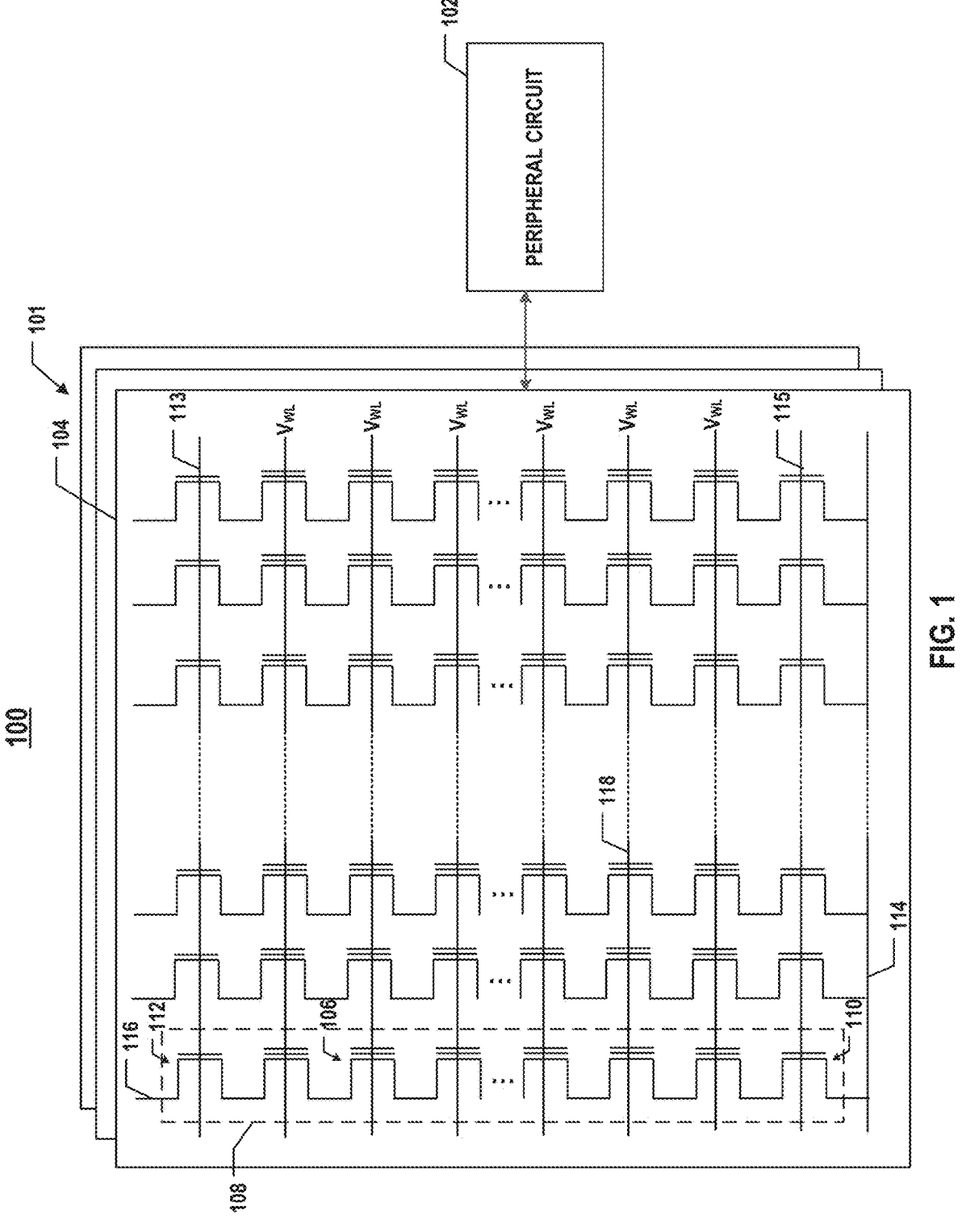
FIG. 1 illustrates a schematic circuit diagram of a memory device including peripheral circuits, according to some aspects of the present disclosure.
Figure 4A:
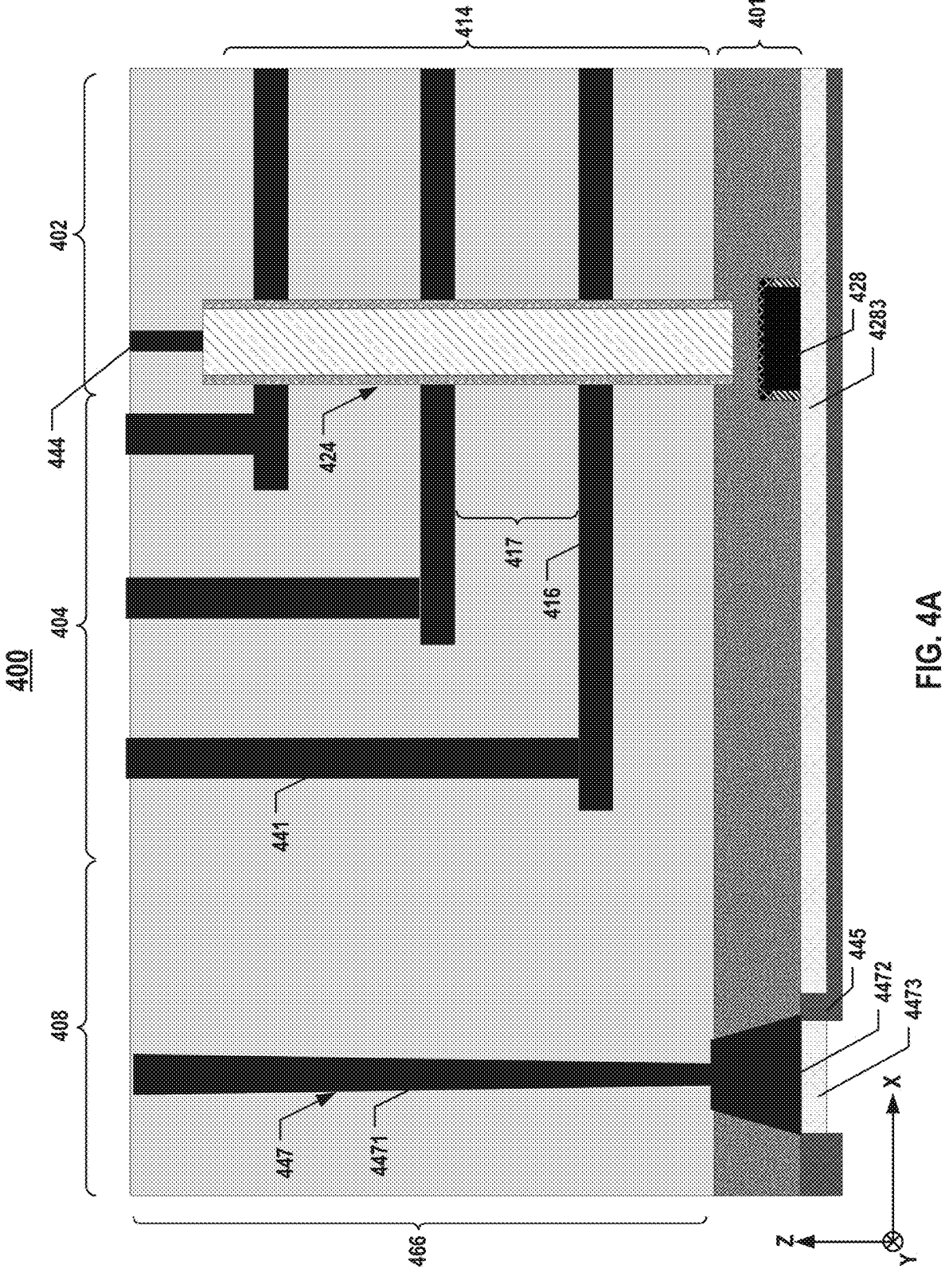
FIG. 4A illustrates a side view of a cross-section of a 3D memory device including a memory array circuit, according to some aspects of the present disclosure.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of 3D NAND memory strings 108 each extending vertically above a substrate (not shown). In some implementations, each 3D NAND memory string 108 includes a plurality of memory cells 106 coupled in series and stacked vertically. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor. Each array of 3D NAND memory strings 108 can include one or more 3D memory devices. For example, FIG. 4A and FIG. 5 illustrate some exemplary 3D NAND memory devices including 3D memory devices 400 and 500.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in four or more memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each 3D NAND memory string 108 can include a source select gate (SSG) transistor 110 at its source end and a drain select gate (DSG) transistor 112 at its drain end. SSG transistor 110 and DSG transistor 112 can be configured to activate selected 3D NAND memory strings 108 (columns of the array) during read and program operations. In some implementations, the sources of SSG transistors 110 of 3D NAND memory strings 108 in the same block 104 are coupled through a same source line (SL) 114, e.g., a common SL, for example, to the ground. DSG transistor 112 of each 3D NAND memory string 108 is coupled to a respective bit line 116 from which data can be read or programmed via an output bus (not shown), according to some implementations. In some implementations, each 3D NAND memory string 108 is configured to be selected or unselected by applying a select voltage (e.g., above the threshold voltage of DSG transistor 112) or a deselect voltage (e.g., 0 V) to respective DSG transistor 112 through one or more DSG lines 113 and/or by applying a select voltage (e.g., above the threshold voltage of SSG transistor 110) or a deselect voltage (e.g., 0 V) to respective SSG transistor 110 through one or more SSG lines 115.

As shown in FIG. 1, 3D NAND memory strings 108 can be organized into multiple blocks 104, each of which can have a common source line 114. In some implementations, each block 104 is the basic data unit for erase operations, i.e., all memory cells 106 on the same block 104 are erased at the same time. Memory cells 106 can be coupled through word lines 118 that select which row of memory cells 106 is affected by read and program operations. In some implementations, each word line 118 is coupled to a row of memory cells 106, which is the basic data unit for program and read operations. Each word line 118 can include a plurality of control gates (gate electrodes) at each memory cell 106 in respective row and a gate line coupling the control gates.

Figure 2:
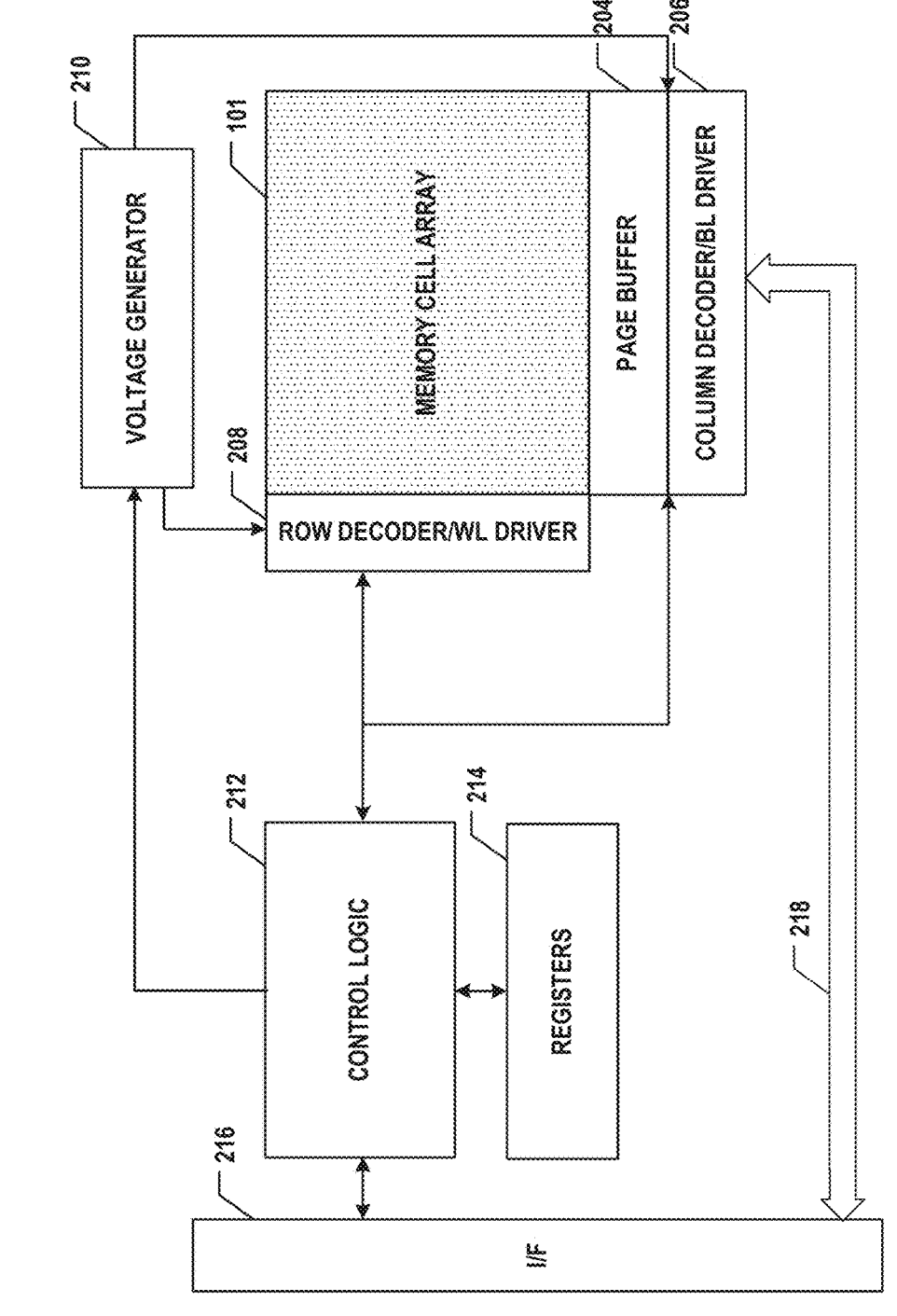
FIG. 2 illustrates a block diagram of a memory device including a memory cell array and peripheral circuits, according to some aspects of the present disclosure.

Peripheral circuits 102 can be coupled to memory cell array 101 through bit lines 116, word lines 118, source lines 114, SSG lines 115, and DSG lines 113. As described above, peripheral circuits 102 can include any suitable circuits for facilitating the operations of memory cell array 101 by applying and sensing voltage signals and/or current signals through bit lines 116 to and from each target memory cell 106 through word lines 118, source lines 114, SSG lines 115, and DSG lines 113. Peripheral circuits 102 can include various types of peripheral circuits formed using complementary metal-oxide semiconductor (CMOS) technologies. For example, FIG. 2 illustrates some exemplary peripheral circuits 102 including a page buffer 204, a column decoder/bit line driver 206, a row decoder/word line driver 208, a voltage generator 210, control logic 212, registers 214, an interface (I/F) 216, and a data bus 218. It is understood that in some examples, additional peripheral circuits 102 may be included as well.

Page buffer 204 can be configured to buffer data read from or programmed to memory cell array 101 according to the control signals of control logic 212. In one example, page buffer 204 may store one page of program data (write data) to be programmed into one row of memory cell array 101. In another example, page buffer 204 also performs program verify operations to ensure that the data has been properly programmed into memory cells 106 coupled to selected word lines 118.

Row decoder/word line driver 208 can be configured to be controlled by control logic 212 and select or unselect a block 104 of memory cell array 101 and select or unselect a word line 118 of selected block 104. Row decoder/word line driver 208 can be further configured to drive memory cell array 101. For example, row decoder/word line driver 208 may drive memory cells 106 coupled to the selected word line 118 using a word line voltage generated from voltage generator 210. In some implementations, row decoder/word line driver 208 can include a decoder and string drivers (driving transistors) coupled to local word lines and word lines 118.

Voltage generator 210 can be configured to be controlled by control logic 212 and generate the word line voltages (e.g., read voltage, program voltage, pass voltage, local voltage, and verification voltage) to be supplied to memory cell array 101. In some implementations, voltage generator 210 is part of a voltage source that provides voltages at various levels of different peripheral circuits 102 as described below in detail. Consistent with the scope of the present disclosure, in some implementations, the voltages provided by voltage generator 210, for example, to row decoder/word line driver 208 and page buffer 204 are above certain levels that are sufficient to perform the memory operations. For example, the voltages provided to page buffer 204 may be between 2 V and 3.3 V, such as 3.3 V, and the voltages provided to row decoder/word line driver 208 may be greater than 3.3 V, such as between 3.3 V and 30 V.

Column decoder/bit line driver 206 can be configured to be controlled by control logic 212 and select one or more 3D NAND memory strings 108 by applying bit line voltages generated from voltage generator 210. For example, column decoder/bit line driver 206 may apply column signals for selecting a set of N bits of data from page buffer 204 to be outputted in a read operation.

Control logic 212 can be coupled to each peripheral circuit 102 and configured to control operations of peripheral circuits 102. Registers 214 can be coupled to control logic 212 and include status registers, command registers, and address registers for storing status information, command operation codes (OP codes), and command addresses for controlling the operations of each peripheral circuit 102.

Interface 216 can be coupled to control logic 212 and configured to interface memory cell array 101 with a memory controller (not shown). In some implementations, interface 216 acts as a control buffer to buffer and relay control commands received from the memory controller and/or a host (not shown) to control logic 212 and status information received from control logic 212 to the memory controller and/or the host. Interface 216 can also be coupled to page buffer 204 and column decoder/bit line driver 206 via data bus 218 and act as an input/output (I/O) interface and a data buffer to buffer and relay the program data received from the memory controller and/or the host to page buffer 204 and the read data from page buffer 204 to the memory controller and/or the host. In some implementations, interface 216 and data bus 218 are part of an I/O circuit of peripheral circuits 102.

Consistent with the scope of the present disclosure, at least one peripheral circuit 102 of memory device 100 can have 3D transistors instead of planar transistors to achieve high speed, low leakage current, high voltage, and small size at the same, without increasing the cost. It is understood that in some examples, both 3D transistors and planar transistors may be used in the same peripheral circuit 102.

Figure 3A:
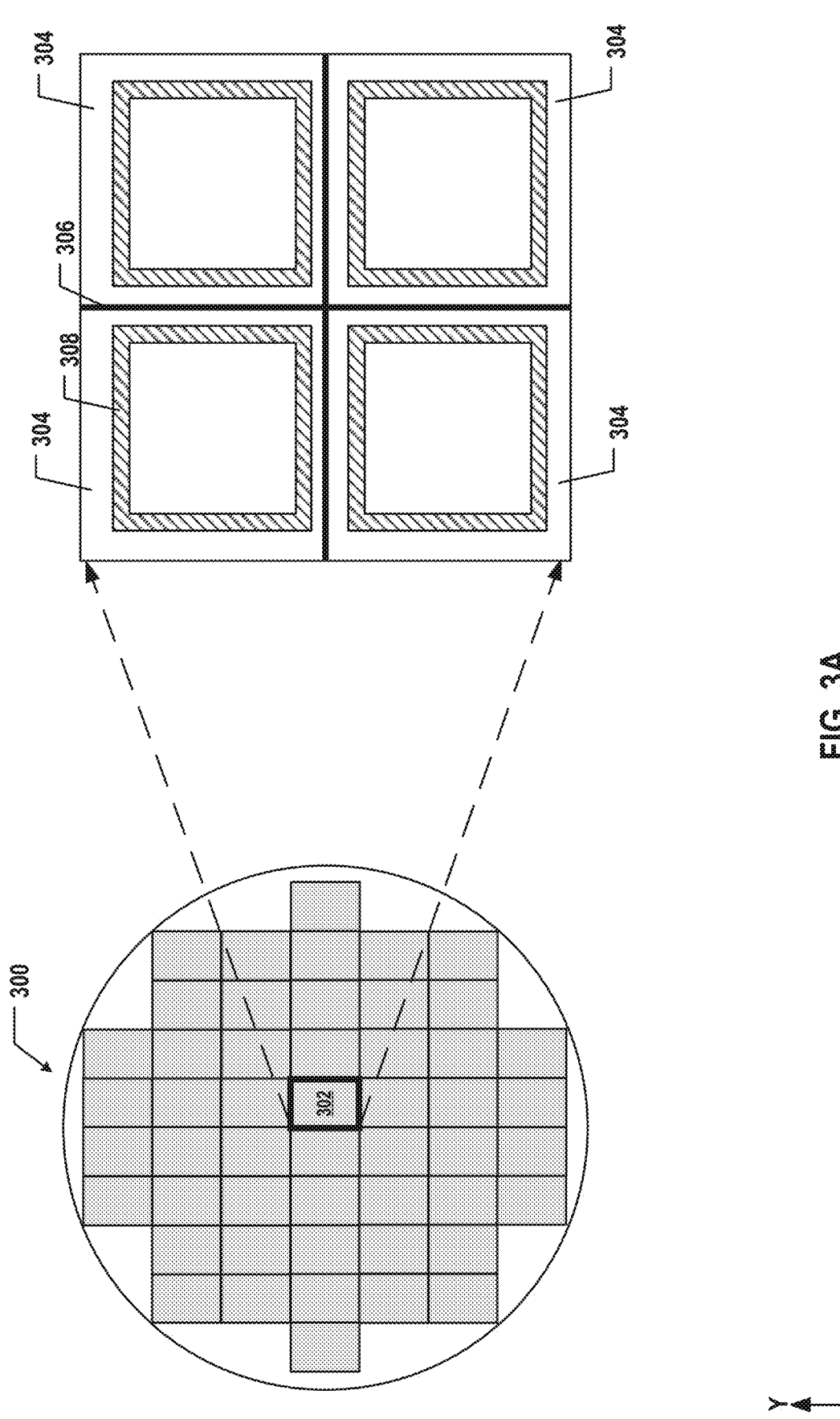
FIG. 3A illustrates a plan view of a wafer having a plurality of semiconductor chips each having seal ring discontinuous contact structures, according to some aspects of the present disclosure.

In semiconductor chips, protection structures (e.g., seal ring structures) for preventing various types of damages, such as Electrostatic Discharge (ESD), oxygen, moisture, and mechanical damages, can be formed for each chip. For example, FIG. 3A illustrates a plan view of a wafer 300 having a plurality of semiconductor chips 304 each having a protection structure 308. Wafer 300 includes multiple shots 302 each including four dies, referred to herein as semiconductor chips 304, separated by scribe lines 306. As shown in FIG. 3A, each semiconductor chip 304 has an adjacent semiconductor chip 304 in a first direction (x-direction) and another adjacent semiconductor chip 304 in a second direction (y-direction) perpendicular to the first direction. Each semiconductor chip 304 includes a protection structure 308 for protecting the semiconductor devices from damages, such as ESD, oxygen, moisture, and mechanical damages.

Figure 3B:
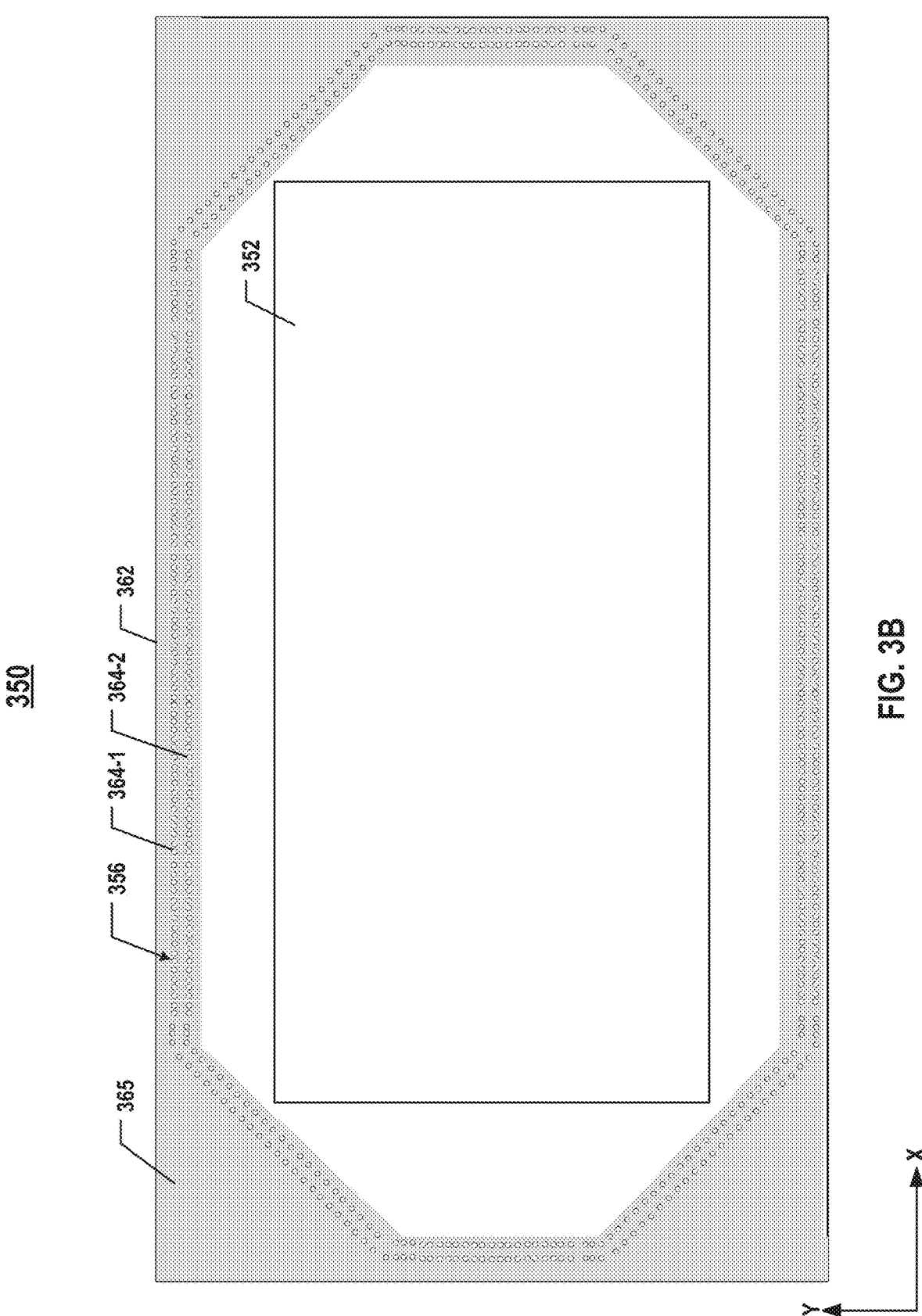
FIG. 3B illustrates a plan view of a semiconductor chip having seal ring discontinuous contact structures, according to some aspects of the present disclosure.

For example, FIG. 3B illustrates a plan view of a semiconductor chip 350 having a protection structure. Semiconductor chip 350 is one example of semiconductor chip 304 having protection structure 308 in FIG. 3A. Semiconductor chip 350 includes a main chip region 352 to be protected by the protection structure. The protection structure in this example includes seal ring structure 356 as shown in the plan view. It is understood that the plan view of FIG. 3B may be at a cross-section in any suitable plane defined by the x-axis and y-axis parallel to the substrate surface. Seal ring structure 356 includes a seal ring dielectric layer 362 and one or more seal ring discontinuous contact structures (e.g., an outer seal ring discontinuous contact structure 364-1 and an inner seal ring discontinuous contact structure 364-2) in seal ring dielectric layer 362. It is noted that it can be more than two seal ring discontinuous contact structures in seal ring structure 356. And each two of the adjacent discontinuous structures from two seal ring discontinuous contact structures (e.g., two adjacent discontinuous structures from outer seal ring discontinuous contact structure 364-1 and inner seal ring discontinuous contact structure 364-2) may be arranged staggered or in alignment with each other in the x- or y-direction in the plan view. In some implementations, each discontinuous contact structure of seal ring discontinuous contact structures (e.g., an outer seal ring discontinuous contact structure 364-1 and an inner seal ring discontinuous contact structure 364-2) may include a circular shape, oval shape, rectangle shape, elongated circular, oval, or rectangle shape, or a combination thereof, in the plan view. While these discontinuous structures may be formed in different shapes in the plan view, it is noted that to minimize the stress and tilting issue caused by the lengthy seal ring structure extending in the z-direction, a circular shape or other symmetrical shapes may be more suitable than asymmetrical shapes. In some implementations, seal ring structure 356 may include a rectangle shape and have four sides connected to enclose main chip region 352 in the plan view. In some implementations, as illustrated as in FIG. 3B, seal ring structure 356 may be arranged along the largest side of a triangle corner 365 of semiconductor chip 350, thereby forming a hexagon shape with six sides connected to enclose main chip region 352 in the plan view. The area of triangle corner 365 can be used as an area for a fan-out pad or test pad, according to some implementations. In some implementations, a single chip such as semiconductor chip 350 (corresponding to semiconductor chip 304 in FIG. 3A) may have at least 100 seal ring discontinuous contact structures (e.g., outer seal ring discontinuous contact structure 364-1 or inner seal ring discontinuous contact structure 364-2) enclosing main chip region 352. In some implementations, the number of seal ring discontinuous contact structures in a single chip can be 10,000 to 100,000.

FIGS. 3C and 3D illustrate plan views of a semiconductor chip having different arrangements of seal ring discontinuous contact structures, according to some aspects of the present disclosure. In some implementations, as shown in FIG. 3C, outer seal ring discontinuous contact structure 364-1 and inner seal ring discontinuous contact structure 364-2 may be arranged in alignment with each other in the x- or y-direction in the plan view. In other implementations, as shown in FIG. 3D, outer seal ring discontinuous contact structure 364-1 and inner seal ring discontinuous contact structure 364-2 may be arranged in a staggered manner in the x- or y-direction in the plan view. In some implementations, each two of the adjacent outer seal ring discontinuous contact structures 364-1 can be arranged to have a minimum distance of, for example, between 1000 nm and 2000 nm. In some implementations, each two of the adjacent outer seal ring discontinuous contact structures 364-1 and inner seal ring discontinuous contact structures 364-2 can be arranged to have a minimum distance between, for example, 200 nm and 800 nm. It is noted that, while the discontinuous arrangement and the distance between the seal ring discontinuous contact structures may be helpful to reduce the stress and solve the tilting issue, the distance cannot be too large to have any protection function as a seal ring.

FIG. 4A illustrates a side view of a cross-section of an exemplary 3D memory device 400 having a seal ring discontinuous contact structure, according to some implementations of the present disclosure. As shown in FIG. 4A, 3D memory device 400 can include a first semiconductor layer 401, which can include silicon (e.g., single crystalline silicon, c-Si, or poly-Si), silicon germanium (SiGe), gallium arsenide (GaAs), germanium (Ge), silicon on insulator (SOI), or any other suitable materials. In some implementations, first semiconductor layer 401 can be a substrate, or a thinned substrate. In some implementations, first semiconductor layer 401 may include a thinned Si substrate formed on a poly-Si substrate. In some implementations, first semiconductor layer 401 may include a poly-Si substrate which are deposited after removing the original or growth substrate. It is noted that x-, y-, and z-axes are included in FIG. 4A to illustrate the spatial relationships of the components in 3D memory device 400. First semiconductor layer 401 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 400) is determined relative to the substrate of the semiconductor device (e.g., first semiconductor layer 401) in the z-direction (the vertical direction perpendicular to the x-y plane) when the substrate is positioned in the lowest plane of the semiconductor device in the z-direction. The same notion for describing spatial relationships is applied throughout the present disclosure.

In some implementations, 3D memory device 400 further includes one or more contact structures (e.g., a staircase contact structure 441, and a seal ring discontinuous contact structure 447) formed in a first semiconductor structure 466. The contact structure can include lateral contact structures and vertical contact structures. In some implementations, staircase contact structure 441 and seal ring discontinuous contact structure 447 are vertical contact structures. It is noted that the "contact structure" herein may refer not only to those structures that connect 3D memory device 400 to word lines, peripheral circuits, but also to those structures extending in the z-direction (e.g., vertical direction) through 3D memory device 400 at least partially surrounding any functional region of 3D memory device 400 and connected to a ground pad, a fan-out pad, a bonding pad, or a landing pad to form an isolation structure or a protection structure of 3D memory device 400. In some implementations, the contact structures may be at least partially surrounded or covered by interlayer dielectric (ILD) (not shown) in the x and/or y-direction (e.g., lateral direction) and extending along the z-direction (e.g., vertical direction) in first semiconductor structure 466. The contact structure can include conductive materials including, but not limited to, tungsten (W), cobalt (Co), copper (Cu), aluminum (Al), silicides, or any combination thereof. The ILD layers in the contact structure can include dielectric materials including, but not limited to, silicon oxide, silicon nitride, silicon oxynitride, low dielectric constant (low-k) dielectrics, or any combination thereof.

In some implementations, seal ring discontinuous contact structure 447 further includes a seal ring body portion 4471 extending in a vertical direction (e.g., in a z-direction) until an upper surface of first semiconductor layer 401, a seal ring through silicon contact (TSC) portion 4472 connected to seal ring body portion 4471 and penetrating through first semiconductor layer 401, and a seal ring contact pad 4473 connected to seal ring TSC portion 4472. A passivation layer 445 may be formed and at least partially surrounding seal ring contact pad 4473 to protect the backside of first semiconductor layer 401 and seal ring contact pad 4473 from damages or leakage path formed therethrough. It is noted that each portion of seal ring discontinuous contact structure 447 may have the same or different materials than the others.

In some implementations, 3D memory device 400 is a NAND Flash memory device in which memory cells are provided in the form of an array of NAND memory strings. As shown in FIG. 4A, 3D memory device 400 can include an array of channel structures 424 functioning as the array of NAND memory strings. As shown in FIG. 4A, each channel structure 424 can extend vertically through a plurality of conductive pairs each including a conductive layer 416 and a dielectric layer 417. The interleaved conductive layers and dielectric layers are part of stack structure 414.

The number of the conductive pairs of conductive layers and dielectric layers in stack structure 414 (e.g., 32, 64, 96, 128, 160, 192, 224, 256, or more) determines the number of memory cells in 3D memory device 400. It is understood that in some implementations, stack structure 414 may have a multi-deck architecture (not shown), which includes a plurality of memory decks stacked over one another. The numbers of the conductive pairs of conductive layers and dielectric layers in each memory deck can be the same or different.

Stack structure 414 can include a plurality of interleaved conductive layers and dielectric layers. In some implementations, stack structure 414 is at least partially surrounded by first semiconductor structure 466 laterally (e.g., in the x- or y-direction). Conductive layers 416 and dielectric layers 417 in stack structure 414 can alternate in the z-direction (e.g., vertical direction). In other words, except the ones at the top or bottom of stack structure 414, each conductive layer 416 can be adjoined by two dielectric layers 417 on both sides, and each dielectric layer 417 can be adjoined by two conductive layers 416 on both sides. Conductive layers 416 can include conductive materials including, but not limited to, W, Co, Cu, Al, polysilicon, doped silicon, silicides, or any combination thereof. Each conductive layer 416 can include a gate electrode (gate line) surrounded by an adhesive layer and a gate dielectric layer. The gate electrode of the conductive layer can extend laterally as a word line, ending at one or more staircase structures of stack structure 414. Dielectric layers 417 can include dielectric materials including, but not limited to, silicon oxide, silicon nitride, silicon oxynitride, or any combination thereof.

As shown in FIG. 4A. 3D memory device 400 includes a core array region 402, a staircase region 404, and a seal ring region 408 in the plan view, according to some implementations of the present disclosure. In FIG. 4A, core array region 402, i.e., center core array region, may be in the center of the stack structure, and staircase region 404, i.e., a side staircase region, may be at one of two sides of the core array region 402 of the stack structure 414 in the x-direction (e.g., the word line direction), according to some implementations. In some implementations, core array region 402 and staircase region 404 are in a memory array main chip region, while seal ring region 408 is at least partially surrounding or enclosing the memory array main chip region laterally (e.g., in the x- or y-direction). In some implementations, seal ring region 408 is arranged at least partially surrounding or enclosing core array region 402, and staircase region 404. In some implementations, core array region 402, i.e., side core array region, may be in two sides or one of two sides of staircase region 404 of stack structure 414, and staircase region 404, i.e., a center staircase region, may be in the center of the of stack structure 414 in the x-direction (e.g., the word line direction), according to some implementations.

In some implementations, channel structure 424 is formed in core array region 402. Channel structure 424 may include a channel hole filled with a semiconductor layer (e.g., as a semiconductor channel) and a composite dielectric layer (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. The remaining space of channel structure 424 can be partially or fully filled with a capping layer including dielectric materials, such as silicon oxide, and/or an air gap. Channel structure 424 can have a cylinder shape (e.g., a pillar shape). The capping layer, the semiconductor channel, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO).

In some embodiments, channel structure 424 further includes a channel plug 444 in the top portion (e.g., at the upper end) of channel structure 424 and a source through silicon contact (TSC) 428 in the bottom portion (e.g., at the lower end) of channel structure 424. As used herein, the "upper end" of a component (e.g., channel structure 424) is the end farther away from first semiconductor layer 401 in the z-direction, and the "lower end" of the component (e.g., channel structure 424) is the end closer to first semiconductor layer 401 in the z-direction when first semiconductor layer 401 is positioned in the lowest plane of 3D memory device 400. Channel plug 444 can include semiconductor materials (e.g., polysilicon) and source TSC 428 may include conductive materials (e.g., W, Co, Cu, or Al). In some embodiments, channel plug 444 functions as the drain of the NAND memory string while source TSC 428 functions as the source of the NAND memory string. In some implementations, a redistribution layer 4283 is formed above source TSC 428 and can include the same material as seal ring contact pad 4473. Redistribution layer 4283 can be formed in the same deposition process as seal ring contact pad 4473. Passivation layer 445 can also be formed at least partially surrounding redistribution layer 4283 to protect redistribution layer 4283 from damages or leakage path formed therethrough.

In some implementations, staircase contact structures 441 are formed in staircase region 404. In some embodiments, each of staircase contact structures 441 is in contact with a respective conductive layer 416 of conductive pair (e.g., a word line) in staircase region 404 of stack structure 414 for word line fan-out. In some implementations, staircase contact structures 441 can be electrically connected to a bit line fan-oud pad. Staircase contact structures 441 can include one or more conductive layers, such as a metal layer (e.g., W, Co, Cu, or Al) or a silicide layer surrounded by an adhesive layer (e.g., TiN).

In some implementations, seal ring discontinuous contact structure 447 is a protection structure (e.g., corresponding to outer seal ring discontinuous contact structure 364-1 or inner seal ring discontinuous contact structure 364-2 in FIG. 3B) formed in seal ring region 408 and at least partially surrounding or enclosing core array region 402 and staircase region 404 in the plan view. In some implementations, seal ring discontinuous contact structures 447 may form a rectangle shape and have four sides connected to enclose core array region 402 and/or staircase region 404 in the plan view, which can also be illustrated as in FIG. 3B. It is noted that seal ring discontinuous contact structure 447 can form a shape that includes any other suitable shapes, such as square, circle, oval, etc., for example, depending on the shape of core array region 402 and staircase region 404 and as those implementations illustrated in FIG. 3B.

Seal ring discontinuous contact structure 447 can be configured to protect 3D memory device 400 in core array region 402 from various types of damages including, but not limited to, heat, gases (e.g., oxygen), liquids (e.g., moisture), mechanical damages (e.g., cutting), and electrical damages (e.g., ESD). Seal ring discontinuous contact structure 447 can provide a hermetic seal to protect 3D memory device 400 in core array region 402 from mechanical damages during cutting and to block entry of external moisture and oxygen into core array region 402, as well as can protect 3D memory device 400 in core array region 402 from ESD. In some embodiments, seal ring discontinuous contact structure 447 is attached to a ceramic or metal lid in the packaging of 3D memory device 400 to form a hermetic seal. In some embodiments, seal ring discontinuous contact structure 447 is electrically connected to an ESD protection circuit and/or the ground.

In some embodiments, seal ring discontinuous contact structure 447 may include a dielectric portion (not shown) and a conductive portion in the dielectric portion. The dielectric portion can fill the entire seal ring discontinuous contact structure 447 except for the area occupied by the conductive portion. That is, the conductive portion of seal ring discontinuous contact structure 447 can be electrically insulated by the dielectric layer. The dielectric portion of seal ring discontinuous contact structure 447 can include any dielectric materials including, but not limited to, silicon oxide, silicon nitride, silicon oxynitride, high dielectric-constant (k) dielectrics (e.g., aluminum oxide, hafnium oxide, zirconium oxide, etc.), or any combination thereof. In some embodiments, the conductive portion of seal ring discontinuous contact structure 447 may be electrically connected to the conductive portion to an ESD protection circuit and or the ground. For example, the conductive portion of seal ring discontinuous contact structure 447 may be electrically connected to the ESD protection circuit and/or the ground through another contact structure of 3D memory device 400, such as a middle-end-of-line (MEOL) contact structure, or a back-end-of-line (BEOL) contact structure. The conductive portion of seal ring discontinuous contact structure 447 can include conductive materials including, but not limited to, W, Co, Cu, Al, silicides, or any combination thereof. In particular, seal ring body portion 4471 may include a metal material, for example, W, and thus have stress and tilting issue, The stress and tilting issue may cause chip failure by failing to connect to seal ring TSC portion 4472. The length of seal ring body portion 4471 may be, for example, between 10 μm and 50 μm extending in the z-direction which generating stresses and may tilt at an angle of, for example, 5 to 10 degrees. This may cause a misalignment between seal ring body portion 4471 and seal ring TSC portion 4472. By having a discontinuous structure (e.g., a via structure) rather than a continuous structure (e.g., a trench structure) as mentioned above, the stress and tilting issue may be reduced. In particular, the symmetrical shape of the seal ring structure 447 also helps to reduce the stress when the seal ring is as lengthy as in such a manner.

FIG. 4B illustrates a side view of a cross-section of a peripheral circuit 450, according to some aspects of the present disclosure. Peripheral circuit 450 includes a second semiconductor layer 451, and a peripheral circuit semiconductor structure 464 formed on second semiconductor layer 451. In some implementations, second semiconductor layer 451 includes a peripheral circuit substrate. In some implementations, second semiconductor layer 451 may include same material as first semiconductor layer 401. Peripheral circuit 450 may further include a transistor 452 formed on second semiconductor layer 451 and in peripheral circuit semiconductor structure 464. In some implementations, transistor 452 is formed in a peripheral circuit main chip region 456. In some implementations, transistor 452 can be connected to staircase contact structure 441 of 3D memory device 400 via a transistor contact structure (not shown) and one or more peripheral circuit via structures (e.g., 471). In some implementations, the transistor contact structure (not shown) configuring to electrically connecting to transistor 452 may extend vertically (e.g., in a z-direction) to second semiconductor layer 451 such that it may be same or similar to peripheral circuit seal ring structure 481. While the transistor contact structure is formed in peripheral circuit main chip region 456, peripheral circuit seal ring structure 481 is formed in a peripheral circuit seal ring region 458. Peripheral circuit 450 further includes peripheral circuit seal ring structure 481 having a peripheral circuit seal ring body portion 4811 and a peripheral circuit seal ring contact portion 4814 connected to peripheral circuit seal ring body portion 4811. Peripheral circuit seal ring structure 481 is formed in peripheral circuit seal ring region 458 which at least partially surrounds or encloses peripheral circuit main chip region 456 laterally (e.g., in the x- or y-direction). It is noted that, in some implementations, peripheral circuit seal ring structure 481 may be a seal ring discontinuous contact structure which may correspond to outer seal ring discontinuous contact structure 364-1 or inner seal ring discontinuous contact structure 364-2 in FIG. 3B. Peripheral circuit seal ring contact portion 4814 may include a peripheral circuit bonding contact 475 formed in contact with bonding interface 454, a peripheral circuit interconnect layer 473 connected to peripheral circuit bonding contact 475, and one or more peripheral circuit via structures 471 connected between peripheral circuit bonding contact 475 and peripheral circuit interconnect layer 473, or between peripheral circuit seal ring body portion 4811 and peripheral circuit interconnect layer 473. In some implementations, because peripheral circuit interconnect layer 473 and peripheral circuit bonding contact 475 are extending laterally (e.g., in the x- or y-direction), one or more peripheral circuit via structures 471 are used to vertically connect between these contact structures or interconnect layers. In some implementations, because peripheral circuit seal ring body portion 4811 is not as long as seal ring body portion 4471, peripheral circuit seal ring body portion 4811 can be a continuous trench rather than a discontinuous via. Therefore, seal ring discontinuous contact structure 447 (e.g., discontinuous via structures) can be coupled to peripheral circuit seal ring structure 481 (e.g., continuous trench structures).

FIG. 5 illustrates a side view of a cross-section of an exemplary 3D memory device 500 having 3D memory device 400 and peripheral circuit 450 coupled to 3D memory device 400 via a bonding interface 454, according to some implementations of the present disclosure. In some implementations, 3D memory device 400 is a memory array device and peripheral circuit 450 is configured to control the operation of the memory array device.

Seal ring structure 447 of 3D memory device 400 may further include seal ring contact portion 4474 connected to seal ring body portion 4471. In particular, seal ring contact portion 4474 may include a seal ring bonding contact 435 formed in contact with bonding interface 454, a seal ring interconnect layer 433 connected to seal ring bonding contact 435, and one or more seal ring via structures 431 connected between seal ring bonding contact 435 and seal ring interconnect layer 433, or between seal ring body portion 4471 and seal ring interconnect layer 433. In some implementations, because seal ring interconnect layer 433 and seal ring bonding contact 435 are extending laterally (e.g., in the x- or y-direction), one or more seal ring via structures 431 are used to vertically connect between these contact structures or interconnect layers. In some implementations, the memory array main chip region (e.g., 402 and 404 in FIG. 4A) of 3D memory device 400 and the peripheral circuit main chip region (e.g., 456 in FIG. 4B) of peripheral circuit 450 are in alignment with each other. In some implementations, the seal ring region (e.g., 408 in FIG. 4A) of 3D memory device 400 and the peripheral circuit seal ring region (e.g., 458 in FIG. 4B) of peripheral circuit 450 are in alignment with each other. As such, the two seal ring regions and the seal ring structures therein can provide protection against various types of damages, moistures, or containments.

To form 3D memory device 500, FIGS. 6A-6B illustrate a fabrication process for forming 3D memory device 500, according to some aspects of the present disclosure. FIG. 7 illustrates a flowchart of a method 700 for forming an exemplary 3D memory device 500, according to some aspects of the present disclosure. It is understood that the operations shown in method 700 are not exhaustive and that other operations can be performed as well before, after, or between any of the illustrated operations. Further, some of the operations may be performed simultaneously, or in a different order than shown in FIG. 7. FIGS. 4A-4B, 5, 6A-6B, and 7 will be described together.

Referring to FIG. 7, method 700 starts at operation 702, in which a stack structure is formed on a substrate. The stack structure includes interleaved conductive layers and dielectric layers in a staircase region of the stack structure on the substrate. And one or more channel structures each extending through a core array region of the stack structure are also formed. For example, as illustrated in FIG. 6A, a stack structure 614 (corresponding to stack structure 414 in FIG. 4A) is formed on a substrate such as a first semiconductor layer 601 (corresponding to first semiconductor layer 401 in FIG. 4A). Stack structure 614 includes a channel structure 624 (corresponding to channel structure 424 in FIG. 4A) formed in a core array region 602 (corresponding to core array region 402 in FIG. 4A) and interleaved conductive layers 616 and dielectric layers 617 (corresponding to interleaved conductive layers 416 and dielectric layers 417 in FIG. 4A) formed in a staircase region 604 (corresponding to staircase region 404 in FIG. 4A). In some implementations, core array region 602 and staircase region 604 may form a main chip region. To form channel structure 624 and interleaved conductive layers 616 and dielectric layers 617, a dielectric stack (not shown) including a plurality pairs of a stack sacrificial layer (not shown) and a stack dielectric layer (not shown), together referred to herein as "dielectric layer pairs," is formed on first semiconductor layer 601. Dielectric stack includes interleaved stack sacrificial layers and stack dielectric layers, according to some embodiments. Stack dielectric layers and stack sacrificial layers can be alternatively deposited on first semiconductor layer 601 to form the dielectric stack. The dielectric stack can be formed by one or more thin film deposition processes including, but not limited to, chemical vapor deposition (CVD), physical vapor deposition (PVD), atomic layer deposition (ALD), or any combination thereof. As illustrated in FIG. 6A, a staircase structure (not shown) can be formed on the edge of the dielectric stack in staircase region 604 (corresponding to staircase region 404). The staircase structure can be formed by performing a plurality of so-called "trim-etch" cycles to the dielectric layer pairs of dielectric stack toward first semiconductor layer 601. Next, a channel hole (not shown) is formed extending vertically through the dielectric stack, and a memory film (not shown) and a semiconductor channel (not shown) are sequentially formed along a sidewall of the channel hole. In some embodiments, fabrication processes for forming the channel hole of channel structure 624 include wet etching and/or dry etching, such as deep reactive-ion etching (DRIE). In some embodiments, the channel hole of channel structure 624 extends further through the top portion of first semiconductor layer 601. Next, the memory film (including a blocking layer, a storage layer, and a tunneling layer) and the semiconductor channel are sequentially formed in this order along sidewalls and the bottom surface of the channel hole. In some embodiments, the memory film is first deposited along the sidewalls and bottom surface of the channel hole, and the semiconductor channel is then deposited over the memory film. The blocking layer, the storage layer, and the tunneling layer can be sequentially deposited in this order using one or more thin film deposition processes, such as ALD, CVD, PVD, any other suitable processes, or any combination thereof, to form the memory film. The semiconductor channel can then be formed by depositing a semiconductor material, such as polysilicon, over the tunneling layer of the memory film using one or more thin film deposition processes, such as ALD, CVD, PVD, any other suitable processes, or any combination thereof. A capping layer (not shown) can be formed in the channel hole and over the semiconductor channel to completely or partially fill the channel hole (e.g., without or with an air gap). A channel plug (not shown) can then be formed in the top portion of the channel hole. Channel structure 624 is thereby formed through the dielectric stack into first semiconductor layer 601. Next, a slit (not shown) is formed extending vertically through the dielectric stack into first semiconductor layer 601. In some embodiments, fabrication processes for forming the slit include wet etching and/or dry etching, such as DRIE. Next, the dielectric stack is replaced with stack structure 614 through the slit, for example, using the so-called "gate replacement" process. In some embodiments, to replace the dielectric stack with stack structure 614, the stack sacrificial layers are replaced with stack conductive layers to form interleaved conductive layers 616 and dielectric layers 617 through the slit.

Method 700 proceeds to operation 704, as illustrated in FIG. 7, in which one or more seal ring body portions are formed in contact with the first semiconductor layer. For example, as illustrated in FIG. 6A, seal ring body portion 6471 of seal ring discontinuous contact structure 647 is formed and extends in a seal ring region 608 (corresponding to seal ring region 408 in FIG. 4A) of a first semiconductor structure 666 (corresponding to 466 in FIG. 4A) until in contact with first semiconductor layer 601.

Method 700 proceeds to operation 706, as illustrated in FIG. 7, in which a seal ring contact portion is formed in contact with the seal ring body portion. For example, as illustrated in FIG. 6A, seal ring contact portion 6474 of seal ring discontinuous contact structure 647 is formed in contact with seal ring body portion 6471. In some implementations, seal ring contact portion 6474 further includes a seal ring bonding contact 635, a seal ring interconnect layer 633, and a seal ring via structure 631 connected between seal ring bonding contact 635 and seal ring interconnect layer 633, and/or between seal ring interconnect layer 633 and seal ring body portion 6471.

Method 700 proceeds to operation 708, as illustrated in FIG. 7, in which a peripheral circuit including a transistor formed in a peripheral circuit semiconductor structure is formed. For example, as illustrated in FIG. 6B, a peripheral circuit 650 including a transistor 652. Transistor 652 is formed on a second semiconductor layer 651 and in a peripheral circuit main chip region 656 of a peripheral circuit semiconductor structure 664.

Method 700 proceeds to operation 710, as illustrated in FIG. 7, in which a peripheral circuit seal ring contact structure extending through the peripheral circuit semiconductor structure is formed. For example, as illustrated in FIG. 6B, a peripheral circuit seal ring contact structure 681 is formed in a peripheral circuit seal ring region 658 and extends through peripheral circuit semiconductor structure 664. Peripheral circuit seal ring contact structure 681 may include a peripheral circuit seal ring body portion 6811, and a peripheral circuit seal ring contact portion 6814 connected to peripheral circuit seal ring body portion 6811. In some implementations, peripheral circuit seal ring contact portion 6814 further includes a peripheral circuit seal ring bonding contact 675, a peripheral circuit seal ring interconnect layer 673, and a peripheral circuit seal ring via structure 671 connected between peripheral circuit seal ring bonding contact 675 and peripheral circuit seal ring interconnect layer 673, and/or between peripheral circuit seal ring interconnect layer 673 and peripheral circuit seal ring body portion 6811.

Method 700 proceeds to operation 712, as illustrated in FIG. 7, in which the peripheral circuit seal ring contact structure is bonded to the seal ring contact portion via a bonding interface. For example, as illustrated in FIG. 6C, peripheral circuit seal ring contact structure 681 is bonded to seal ring discontinuous contact structure 647 via a bonding interface 654.

Method 700 proceeds to operation 714, as illustrated in FIG. 7, in which a seal ring through silicon contact portion is formed in contact with the respective seal ring body portion. For example, as illustrated in FIG. 6C, a seal ring through substrate recess 6477 is formed by etching part of the substrate and expose stack structure 614 and seal ring body portion 6471 of seal ring structure 647. The etching process includes wet etching or dry etching. The dimension of seal ring through substrate recess 6477 may be between 350 nm and 500 nm. And the dimension of seal ring body portion 6471 may be between 200 nm and 350 nm. Therefore, the window for alignment is sufficient to connect seal ring body portion with the later formed seal ring through silicon contact (TSC) portion. In some implementations, first semiconductor layer 601 can be planarized or thinned before etching to form seal ring through substrate recess 6477. In some implementations, planarizing or thinning first semiconductor layer 601 includes applying a chemical mechanical polishing (CMP) on first semiconductor layer 601. In some implementations, a source through substrate recess 6281 can be formed in the same etching process. Next, after forming seal ring through substrate recess 6477 and source through substrate recess 6281, a seal ring through silicon contact (TSC) portion (e.g., 4472 in FIG. 4A or 5) is formed in seal ring through substrate recess 6477 and in contact with respective seal ring body portion 6471, and source TSC (e.g., 428 in FIG. 4A or 5) is formed in source through substrate recess 6281.

FIG. 8 illustrates a block diagram of a system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive the data to or from memory devices 804.

Memory devices 804 can be any memory devices disclosed herein, such as memory devices 100, 400, or 500. In some implementations, each memory device 804 includes a 3D memory device, as described above in detail.

Memory controller 806 is coupled to memory device 804 and host 808 and is configured to control memory device 804, according to some implementations. Memory controller 806 can manage the data stored in memory device 804 and communicate with host 808. In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804. Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 806 and one or more memory devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 9A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 8). In another example as shown in FIG. 9B, memory controller 806 and multiple memory devices 804 may be integrated into an SSD 906. SSD 906 can further include an SSD connector 908 coupling SSD 906 with a host (e.g., host 808 in FIG. 8). In some implementations, the storage capacity and/or the operation speed of SSD 906 is greater than those of memory card 902.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations but should be defined only in accordance with the following claims and their equivalents.

What is claimed is:

1. A semiconductor device, comprising:
   a first semiconductor layer;
   a first semiconductor structure on the first semiconductor layer comprising a main chip region, wherein the first semiconductor structure comprises a first stack structure having interleaved conductive layers and dielectric layers;
   one or more channel structures each extending through a core array region of the first stack structure;
   seal ring discontinuous contact structures in a seal ring region;
   a source contact on a bottom portion of the one or more channel structures; and
   a channel plug on a top portion of the one or more channel structures,
   wherein the seal ring region encloses the main chip region, and
   wherein each seal ring discontinuous contact structure comprises a seal ring body portion extending until the first semiconductor layer.

2. The semiconductor device of claim 1, wherein a length of the seal ring body portion is between 10 μm and 50 μm.

3. The semiconductor device of claim 1, wherein the seal ring discontinuous contact structures form a rectangle shape and have four sides in a plan view.

4. The semiconductor device of claim 1, wherein the seal ring discontinuous contact structures form a hexagon shape with six sides in a plan view.

5. The semiconductor device of claim 1, wherein each seal ring discontinuous contact structure comprises circular shape, oval shape, rectangle shape, elongated circular, oval, or rectangle shape, in a plan view.

6. The semiconductor device of claim 1, wherein the seal ring discontinuous contact structures comprise inner seal ring discontinuous contact structures and outer seal ring discontinuous contact structures at least partially surrounding the inner seal ring discontinuous contact structures.

7. The semiconductor device of claim 6, wherein each two of the adjacent outer seal ring discontinuous contact structures and inner seal ring discontinuous contact structures are staggered arranged in a plan view.

8. The semiconductor device of claim 6, wherein each two of the adjacent outer seal ring discontinuous contact structures and inner seal ring discontinuous contact structures are arranged in aligned with each other in a plan view.

9. The semiconductor device of claim 6, wherein each two of the adjacent inner seal ring discontinuous contact structures have a minimum distance between 1000 nm and 2000 nm.

10. The semiconductor device of claim 6, wherein each two of the adjacent outer seal ring discontinuous contact structures and inner seal ring discontinuous contact structures have a minimum distance between 200 nm and 800 nm.

11. The semiconductor device of claim 1, wherein the first semiconductor structure comprises a first stack structure having interleaved conductive layers and dielectric layers, and the first stack structure comprises the core array region and a staircase region in a plan view, wherein the main chip region comprises the core array region and the staircase region, and wherein the semiconductor device comprises one or more channel structures each extending through the core array region of the first stack structure.

12. The semiconductor device of claim 1, further comprising:

a through silicon contact (TSC) portion penetrating through the first semiconductor layer and coupled to the seal ring body portion.

13. The semiconductor device of claim 1, further comprising:

a transistor in a peripheral circuit main chip region; and a peripheral circuit seal ring contact structure in a peripheral circuit seal ring region which encloses the peripheral circuit main chip region laterally, wherein the peripheral circuit seal ring contact structure is coupled to the seal ring discontinuous contact structures.

14. The semiconductor device of claim 13, further comprising:

a transistor contact structure in the peripheral circuit main chip region connected between the transistor and the first semiconductor structure.

15. The semiconductor device of claim 1, further comprising:

a transistor in the main chip region of the first semiconductor structure.

16. The semiconductor device of claim 1, wherein the one or more channel structures are arranged as an array of NAND memory strings.

17. The semiconductor device of claim 1, wherein each of the one or more channel structures extends through the interleaved conductive layers and dielectric layers.

18. The semiconductor device of claim 1, wherein the one or more channel structures have a pillar shape.

19. The semiconductor device of claim 18, wherein each of the one or more channel structures comprises, radially from a center to an outer surface of the pillar shape:

a capping layer, a semiconductor channel, a tunneling layer, a storage layer, and a blocking layer sequentially arranged.

* * * * *